United States Patent
Zhang et al.

(10) Patent No.: US 10,312,163 B2
(45) Date of Patent: Jun. 4, 2019

(54) METHOD OF IMPROVING SURFACE SMOOTHNESS OF DUMMY GATE

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Yan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/995,283

(22) Filed: Jun. 1, 2018

(65) Prior Publication Data
US 2019/0074228 A1    Mar. 7, 2019

(30) Foreign Application Priority Data
Sep. 1, 2017   (CN) .......................... 2017 1 0778312

(51) Int. Cl.
*H01L 21/66*   (2006.01)
*H01L 21/321*   (2006.01)
*H01L 21/683*   (2006.01)

(52) U.S. Cl.
CPC .......... *H01L 22/12* (2013.01); *H01L 21/3212* (2013.01); *H01L 21/32115* (2013.01); *H01L 21/6831* (2013.01)

(58) Field of Classification Search
CPC ............... H01L 22/12; H01L 21/02074; H01L 21/32115; H01L 21/3212; H01L 21/7684
See application file for complete search history.

(56) References Cited

U.S. PATENT DOCUMENTS

| 8,252,689 | B2 * | 8/2012 | Yang ................. H01L 21/31053 257/E21.23 |
| 2011/0312180 | A1 * | 12/2011 | Wang ................. H01L 21/31055 438/692 |

(Continued)

*Primary Examiner* — Robert G Bachner
*Assistant Examiner* — Molly K Reida
(74) *Attorney, Agent, or Firm* — Brinks Gilson & Lione

(57) ABSTRACT

The present disclosure relates to the field of semiconductor technologies, and discloses a method for manufacturing a semiconductor apparatus. An implementation of the method may include: providing a substrate structure; depositing a dummy gate material layer on the substrate structure; performing planarization processing on the dummy gate material layer; after the planarization processing, performing, according to surface roughness of the dummy gate material layer, first etching on the dummy gate material layer by using a fluorine-containing gas; after the first etching, forming a fluorine-containing polymer layer on the dummy gate material layer; and performing second etching on the substrate structure on which the fluorine-containing polymer layer is formed, to remove the fluorine-containing polymer layer, where the second etching includes etching a surface of the dummy gate material layer. The method of the present invention improves surface smoothness and thickness uniformity of the dummy gate material layer.

13 Claims, 4 Drawing Sheets

(56) References Cited

U.S. PATENT DOCUMENTS

| | | | |
|---|---|---|---|
| 2015/0255302 A1* | 9/2015 | Yoon | H01L 21/3247 438/14 |
| 2015/0380245 A1* | 12/2015 | Zhang | H01L 21/02422 438/14 |
| 2016/0268125 A1* | 9/2016 | Li | H01L 21/31051 |

* cited by examiner

METHOD OF IMPROVING SURFACE SMOOTHNESS OF DUMMY GATE

RELATED APPLICATIONS

The present application claims priority to Chinese Patent Appln. No. 201710778312.9, filed Sep. 1, 2017, the entire disclosure of which is hereby incorporated by reference.

BACKGROUND

Technical Field

The present disclosure relates to the field of semiconductor technologies, in particular, to a method for manufacturing a semiconductor apparatus, and more specifically, to a method for improving surface smoothness of a dummy gate material layer.

Related Art

Currently, a process of manufacturing a semiconductor apparatus usually relates to processes of forming a dummy gate material layer on a semiconductor fin and then performing Chemical Mechanical Planarization (CMP) on the dummy gate material layer. The CMP process smoothes a surface of the dummy gate material layer and equalizes a thickness of the dummy gate material layer. However, it is increasingly difficult for an existing CMP process to satisfy stricter thickness requirements. A dummy gate has large undulations or variations in thickness and a surface that is not so smooth, and cannot satisfy stricter smoothness requirements. Consequently, a formed device has relatively poor performance.

SUMMARY

The inventor of the present disclosure finds problems existing in the foregoing prior art and provides a novel technical solution directed to at least one of the problems.

In a first aspect of the present disclosure, a method for manufacturing a semiconductor apparatus is provided. The method may include: providing a substrate structure; depositing a dummy gate material layer on the substrate structure; performing planarization processing on the dummy gate material layer; after the planarization processing, performing, according to surface roughness of the dummy gate material layer, first etching on the dummy gate material layer using a fluorine-containing gas; after the first etching, forming a fluorine-containing polymer layer on the dummy gate material layer; and performing second etching on the substrate structure on which the fluorine-containing polymer layer is formed, to remove the fluorine-containing polymer layer, where the second etching includes etching a surface of the dummy gate material layer.

In some implementations, the step of performing, according to surface roughness of the dummy gate material layer, first etching on the dummy gate material layer using a fluorine-containing gas includes: detecting a raised portion and a recessed portion of the dummy gate material layer surface, to obtain the surface roughness of the dummy gate material layer; placing the substrate structure on an electrostatic chuck (ESC), and setting a temperature of each region of the ESC according to the surface roughness of the dummy gate material layer, where in the ESC, a temperature of a region corresponding to the raised portion is higher than a temperature of a region corresponding to the recessed portion; and performing first etching on the dummy gate material layer by using a fluorine-containing gas.

In some implementations, the step of performing first etching on the dummy gate material layer using a fluorine-containing gas includes: in a reaction chamber, under conditions of an atmospheric pressure ranging from 5 to 200 millitorrs (mTorr), an operating power of an etching device ranging from 100 to 1000 watts, and a bias voltage ranging from 0 to 300 volts, performing first etching on the dummy gate material layer by using a fluorine-containing gas.

In some implementations, the fluorine-containing gas includes $CH_4F_6$, $CH_2F_2$, or $NF_3$.

In some implementations, in the step of performing second etching, an etching rate of the second etching for the fluorine-containing polymer layer is basically equal to an etching rate for the dummy gate material layer.

In some implementations, the step of forming a fluorine-containing polymer layer on the dummy gate material layer includes: depositing a fluorine-containing polymer layer on the dummy gate material layer using a gas mixture containing $CH_3F$ and $Cl_2$ and using an inert gas as a carrier gas under a condition of a zero-bias voltage.

In some implementations, a material of the fluorine-containing polymer layer includes: a carbon-hydrogen-fluorine polymer.

In some implementations, the second etching is performed using $CF_4$ or $CH_2F_2$ as an etching gas.

In some implementations, the step of performing the second etching using CF4 as an etching gas includes: in a reaction chamber, under conditions of an atmospheric pressure ranging from 10 to 200 mTorr, an operating power of an etching device ranging from 50 to 1000 watts, and a gas flow rate of $CF_4$ ranging from 10 to 500 sccm, performing the second etching; or the step of performing the second etching by using $CH_2F_2$ as an etching gas includes: in a reaction chamber, under conditions of an atmospheric pressure ranging from 10 to 200 mTorr, an operating power of an etching device ranging from 50 to 1000 watts, and a gas flow rate of $CH_2F_2$ ranging from 2 to 100 sccm, performing the second etching.

In some implementations, the method further includes: cyclically performing the step of forming a fluorine-containing polymer layer and the step of performing second etching multiple times.

In some implementations, the method further includes: after the performing the second etching, performing ashing processing.

In some implementations, a material of the dummy gate material layer includes polysilicon or amorphous silicon.

In some implementations, in the step of providing a substrate structure, the substrate structure includes: a semiconductor substrate, a semiconductor fin on the semiconductor substrate, a trench separation portion surrounding the semiconductor fin, and a dummy gate insulator layer on a surface of the semiconductor fin; and in the step of depositing a dummy gate material layer on the substrate structure, the dummy gate material layer covers the trench separation portion and the dummy gate insulator layer.

In forms of the foregoing method, after a dummy gate material layer is formed, planarization processing is first performed on the dummy gate material layer. Then, first etching is performed according to surface roughness of the dummy gate material layer using a fluorine-containing gas, so as to improve overall surface smoothness and thickness uniformity of the dummy gate material layer. Then a fluorine-containing polymer layer is formed on the dummy gate material layer, and second etching is performed on the substrate structure on which the fluorine-containing polymer layer is formed, to remove the fluorine-containing polymer layer, where the second etching further includes etching a surface of the dummy gate material layer, so as to further improve surface smoothness and thickness uniformity of the dummy gate material layer.

Exemplary embodiments and implementations of the present disclosure are described in detail by referring to the following accompanying drawings, so as to make other features and advantages of the present disclosure more comprehensible.

BRIEF DESCRIPTION OF THE DRAWINGS

Accompanying drawings that constitute a part of the description describe embodiments and implementations of the present disclosure and are used, together with the description, to explain one or more principles of the present disclosure.

Referring to the accompanying drawings, the present disclosure can be understood more clearly according to the following detailed descriptions, wherein.

DETAILED DESCRIPTION

Figure 1:
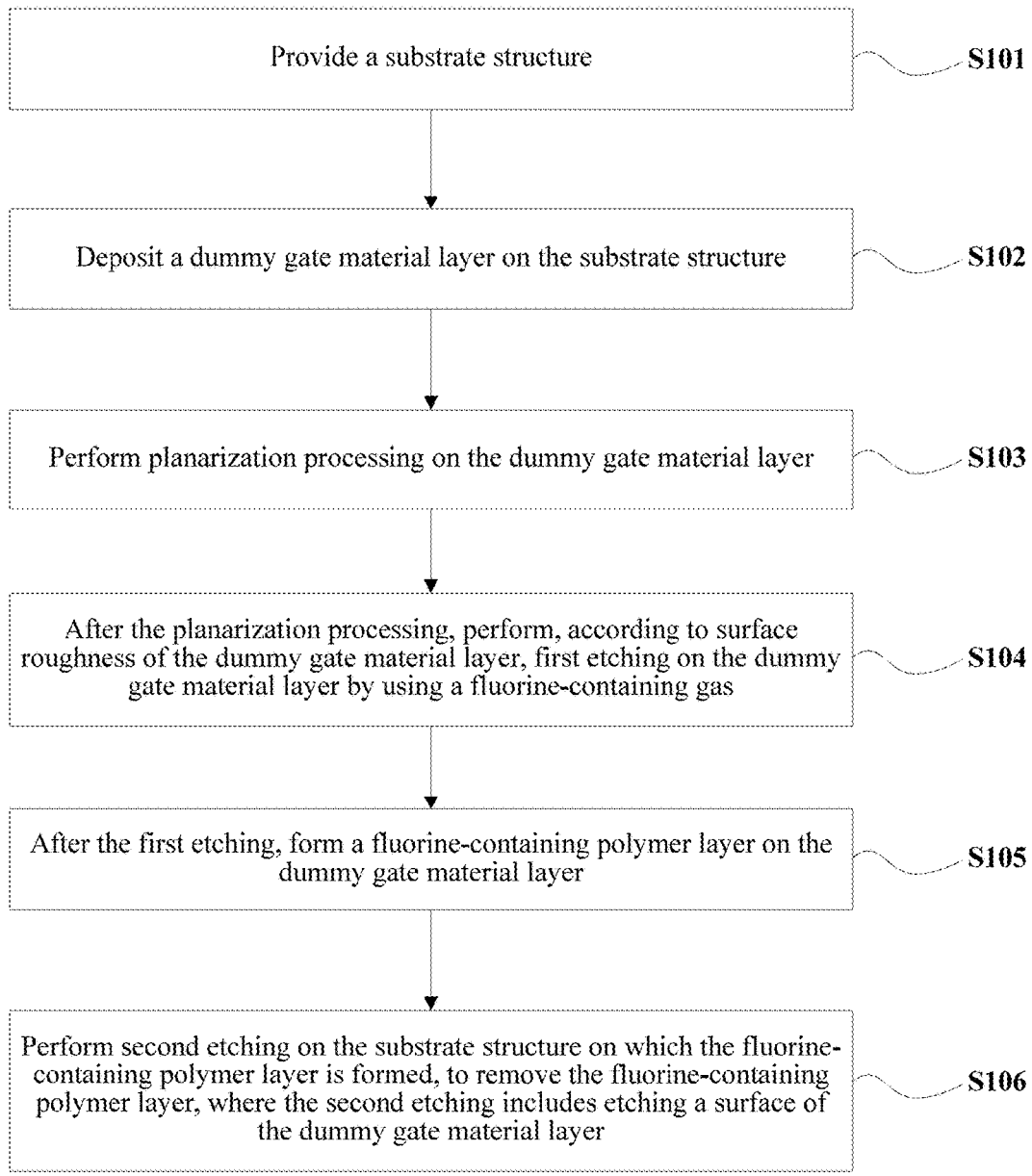
FIG. 1 shows a flowchart of a method for manufacturing a semiconductor apparatus.

Various exemplary embodiments and implementations of the present disclosure are described now in detail by referring to the accompanying drawings. It should be noted that unless otherwise specified, the relative disposition, numerical expressions, and numerical values of the components and steps described in the embodiments and implementations do not limit the scope of the present disclosure.

Meanwhile, it should be understood that to facilitate description, sizes of respective components in the drawings are not drawn according to the actual proportional relationships.

The following descriptions on at least one exemplary embodiment are merely descriptive and shall not serve as any limitations to the present disclosure and application or use thereof.

The technologies, methods, and devices known by those of ordinary skill in the art may be not discussed in detail, but in a proper situation, the technologies, methods, and devices may serve as a part of the description.

In all of the examples shown and discussed therein, any specific values should be interpreted as being illustrative, instead of limiting. Therefore, other examples of an exemplary embodiment may have different values.

It should be noted that similar reference signs and letters represent similar items in the following accompanying drawings. Therefore, once a specific item is defined in one accompanying drawing, it is unnecessary to further discuss the item in the following accompanying drawings.

FIG. 1 shows a flowchart of a method for manufacturing a semiconductor apparatus. FIG. 2 to FIG. 7 illustratively show cross-sectional views of a structure in several stages of a process for manufacturing a semiconductor apparatus. A process for manufacturing a semiconductor apparatus according to one implementations of the present disclosure is described below in detail with reference to FIG. 1 and FIG. 2 to FIG. 7.

As shown in FIG. 1, step S101: Provide a substrate structure.

Figure 2:
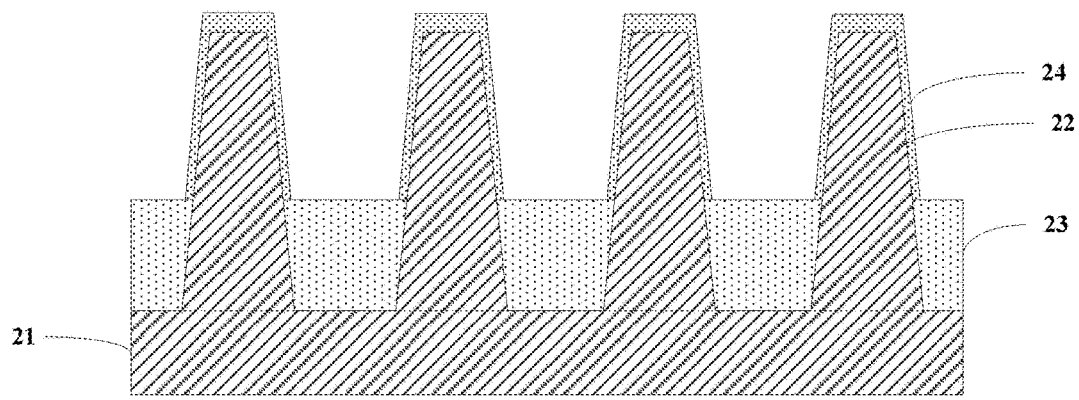
FIG. 2 illustratively shows a cross-sectional view of a structure in a stage of a process for manufacturing a semiconductor apparatus.

FIG. 2 illustratively shows a cross-sectional view of a structure in step S101 of a process for manufacturing a semiconductor apparatus. As shown in FIG. 2, a substrate structure is provided. For example, the substrate structure may include: a semiconductor substrate 21, a semiconductor fin 22 on the semiconductor substrate 21, a trench separation portion 23 surrounding the semiconductor fin 22, and a dummy gate insulator layer 24 on a surface of the semiconductor fin 22. For example, materials of the semiconductor substrate 21 and the semiconductor fin 22 may both include silicon, and a material of the dummy gate insulator layer 24 may include silicon oxide. The trench separation portion 23 may include a trench surrounding the semiconductor fin and a trench insulator layer (for example, silicon oxide) in the trench. For example, the trench separation portion may be a Shallow Trench Isolation (STI) structure. In some implementations, the substrate structure shown in FIG. 2 is formed on a wafer.

Returning to FIG. 1, step S102: Deposit a dummy gate material layer on the substrate structure.

Figure 3:
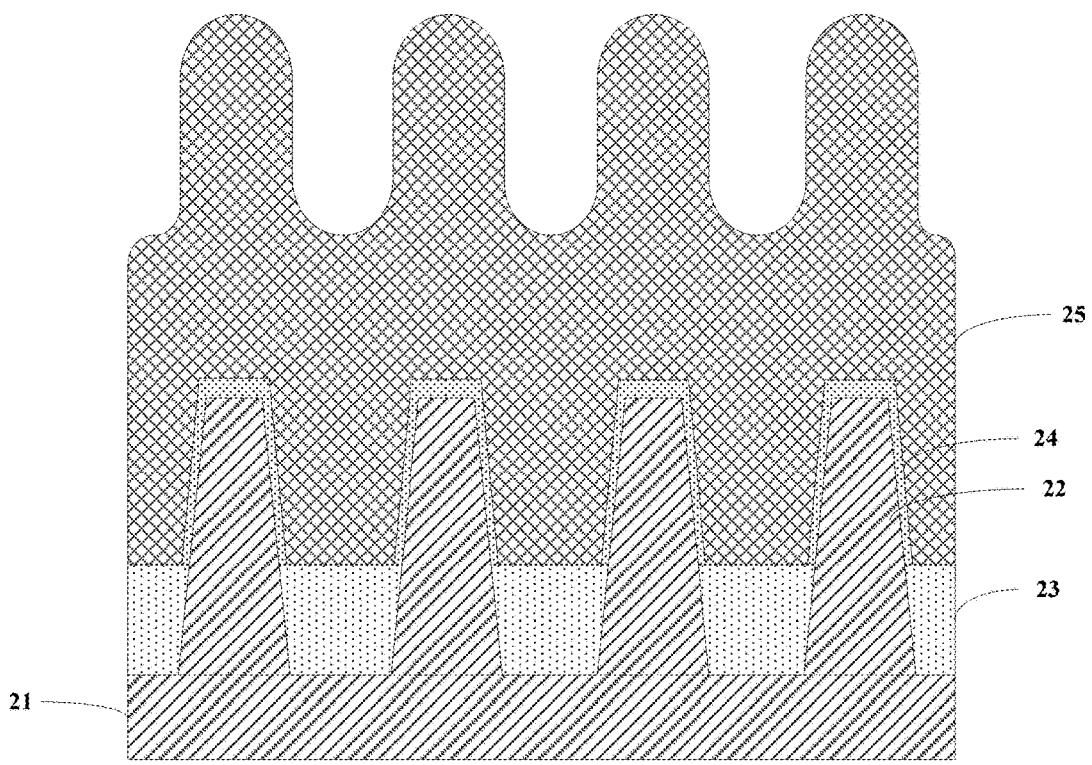
FIG. 3 illustratively shows a cross-sectional view of a structure in a stage of a process for manufacturing a semiconductor apparatus.

FIG. 3 illustratively shows a cross-sectional view of a structure in step S102 of a process for manufacturing a semiconductor. As shown in FIG. 3, a dummy gate material layer 25 is deposited on the substrate structure shown in FIG. 2. In this step, the dummy gate material layer 25 covers the trench separation portion 23 and the dummy gate insulator layer 24. For example, a material of the dummy gate material layer may include polysilicon or amorphous silicon. Amorphous silicon is preferably selected as the material of the dummy gate material layer. As shown in FIG. 3, in a process of the deposition for forming the dummy gate material layer 25, surface smoothness of the dummy gate material layer is relatively poor. For example, a portion of the dummy gate material layer above the semiconductor fin is raised upward relatively highly, and a portion of the dummy gate material layer above the trench separation portion is recessed downward relatively deeply.

Returning to FIG. 1, step S103: Perform planarization processing on the dummy gate material layer.

Figure 4:
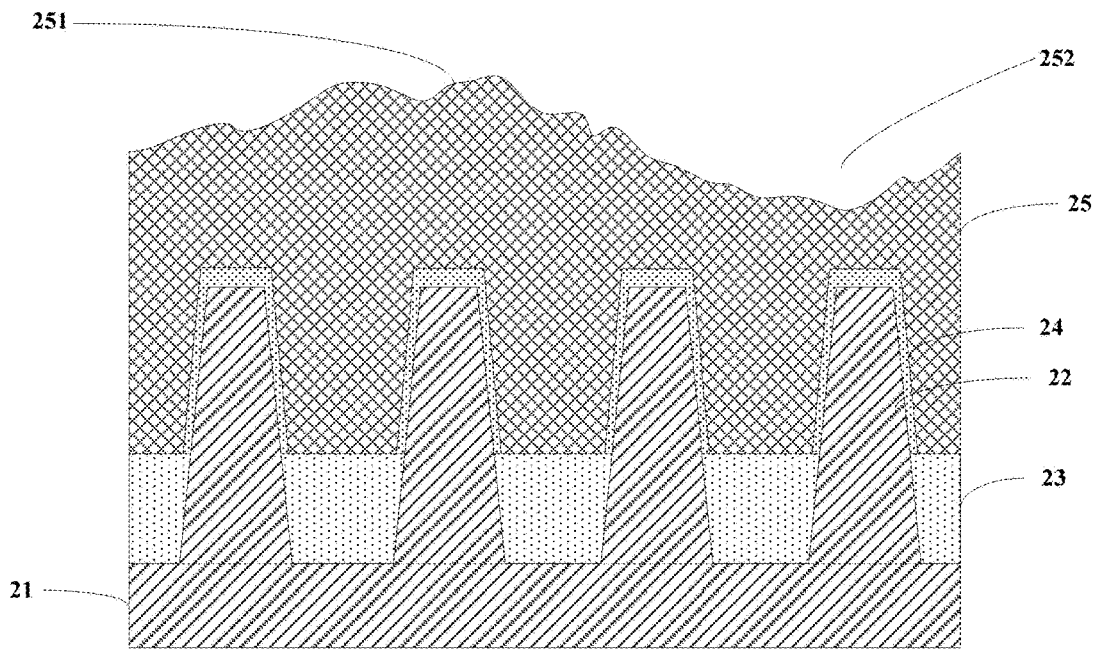
FIG. 4 illustratively shows a cross-sectional view of a structure in a stage of a process for manufacturing a semiconductor apparatus.

FIG. 4 illustratively shows a cross-sectional view of a structure in step S103 of a process for manufacturing a semiconductor apparatus. As shown in FIG. 3, planarization processing is performed on the dummy gate material layer 25 using a CMP process. Compared with the dummy gate material layer in FIG. 3, the planarized dummy gate material layer has its surface smoothness improved and its thickness uniformity improved. As shown in FIG. 3, a surface of the dummy gate material layer includes a raised portion 251 and a recessed portion 252. Therefore, surface roughness of the dummy gate material layer still needs to be further alleviated.

It should be noted that the surface roughness herein indicates a height variation situation and a distribution of the raised portion and the recessed portion, that is, a height variation from the bottom of the recessed portion to the top of the raised portion and a distribution region of the raised portions and the recessed portions, and the like, of the surface of the dummy gate material layer.

Returning to FIG. 1, step S104: After the planarization processing, perform, according to surface roughness of the dummy gate material layer, first etching on the dummy gate material layer by using a fluorine-containing gas.

Figure 5:
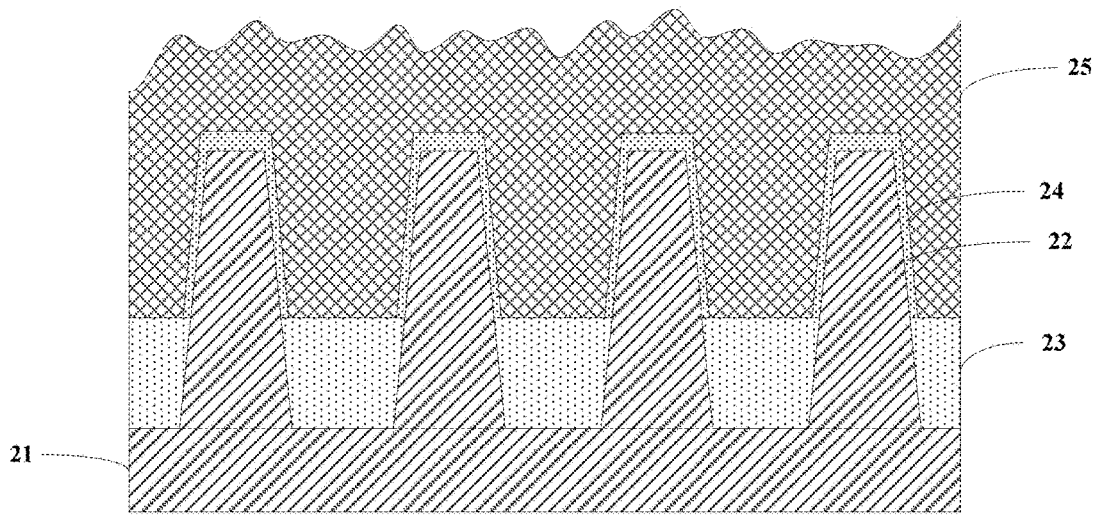
FIG. 5 illustratively shows a cross-sectional view of a structure in a stage of a process for manufacturing a semiconductor apparatus.

FIG. 5 illustratively shows a cross-sectional view of a structure in step S104 of a process for manufacturing a semiconductor apparatus. As shown in FIG. 5, first etching (for example, back etching) is performed on the dummy gate material layer 25 according to the surface roughness of the dummy gate material layer by using a fluorine-containing gas, so as to improve overall surface smoothness and thickness uniformity of the dummy gate material layer.

In some implementations, step S104 may include: detecting a raised portion 251 and a recessed portion 252 of the dummy gate material layer surface, to obtain the surface roughness of the dummy gate material layer 25, as shown in FIG. 4.

In some implementations, step S104 may further include: placing the substrate structure on an ESC, and setting a temperature of each region of the ESC according to the surface roughness of the dummy gate material layer 25. In the ESC, a temperature of a region corresponding to the raised portion 251 is higher than a temperature of a region corresponding to the recessed portion 252. For example, the ESC may be a Hydra (a product name of a ESC)-type ESC. Generally, the ESC is divided into many regions. For example, the ESC may have tens of regions, and temperatures of the regions may be adjusted separately. In this implementation, a temperature of each region of the ESC is set according to the surface roughness of the dummy gate material layer. For example, a temperature of a region corresponding to the raised portion is set to be relatively high, and a temperature of a region corresponding to the recessed portion is set to be relatively low, so that a temperature of the raised portion is relatively high, and a temperature of the recessed portion is relatively low.

In some implementations, step S104 may further include: performing first etching on the dummy gate material layer using a fluorine-containing gas. In the preceding step, in the ESC, a temperature of a region corresponding to the raised portion 251 is higher than a temperature of a region corresponding to the recessed portion 252, so that a temperature of the raised portion is higher than a temperature of the recessed portion, and during the process of the first etching, a portion having a higher temperature in the dummy gate material layer is etched more and faster. Therefore, compared with the recessed portion, the raised portion is etched more and faster, so that an overall surface of the dummy gate material layer is smoother, and an overall thickness of the dummy gate material layer is more uniform, as shown in FIG. 5.

In some implementations, the step of performing first etching on the dummy gate material layer using a fluorine-containing gas may include: in a reaction chamber, under conditions of an atmospheric pressure ranging from 5 to 200 mTorr (for example, the atmospheric pressure may be 20 mTorr, 50 mTorr, 100 mTorr, or the like), an operating power of an etching device ranging from 100 to 1000 watts (for example, the operating power of the etching device is 200 watts, 500 watts, 800 watts, or the like), and a bias voltage ranging from 0 to 300 volts (for example, the bias voltage is 10 volts, 50 volts, 100 volts, 200 volts, or the like), performing first etching on the dummy gate material layer by using a fluorine-containing gas. For example, the fluorine-containing gas may include $CH_4F_6$, $CH_2F_2$, $NF_3$, or the like.

Returning to FIG. 1, step S105: After the first etching, form a fluorine-containing polymer layer on the dummy gate material layer.

Figure 6:
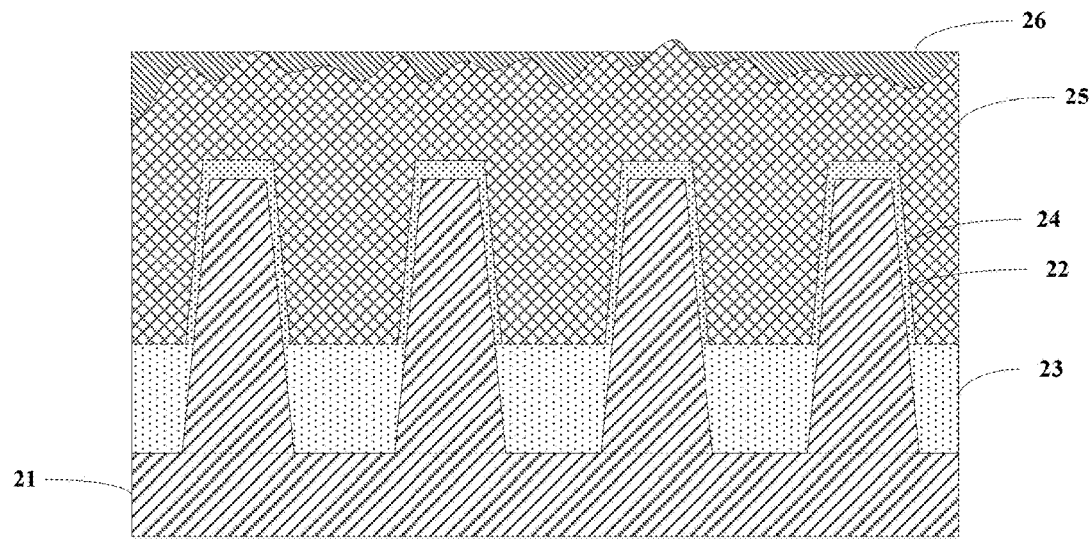
FIG. 6 illustratively shows a cross-sectional view of a structure in a stage of a process for manufacturing a semiconductor apparatus.

FIG. 6 illustratively shows a cross-sectional view of a structure in step S105 of a process for manufacturing a semiconductor apparatus. As shown in FIG. 6, a fluorine-containing polymer layer 26 is formed on the dummy gate material layer 25. In some implementations, step S105 may include: depositing a fluorine-containing polymer layer 26 on the dummy gate material layer 25 by using a gas mixture containing $CH_3F$ and $Cl_2$ and by using an inert gas (for example, Ar) as a carrier gas under a condition of a zero-bias voltage. It should be understood by those skilled in the art that the fluorine-containing polymer layer may alternatively be deposited under a condition other than the zero-bias voltage. Therefore, the scope of the present disclosure is not limited thereto. The fluorine-containing polymer layer is preferably deposited under the condition of the zero-bias voltage, so that the fluorine-containing polymer layer does not have a transverse bias in the deposition process. Therefore, the deposition is more uniform. For example, a material of the fluorine-containing polymer layer may include a carbon-hydrogen-fluorine polymer (that is, $C_xH_yF_z$) or the like.

In the foregoing first etching process, although the overall surface smoothness of the dummy gate material layer is improved, the surface may still have tiny undulations or variations. That is, there are a tiny raised portion and a tiny recessed portion, as shown in FIG. 5. Moreover, in step S105, the fluorine-containing polymer layer may be filled in a recessed portion in the undulations or variations. Alternatively, during the deposition process, the fluorine-containing polymer is deposited relatively thickly at the recessed portion, and is deposited relatively thinly at the raised portion, so that the surface of the dummy gate material layer is relatively smooth, as shown in FIG. 6, which is prepared for subsequent second etching.

Returning to FIG. 1, step S106: Perform second etching on the substrate structure on which the fluorine-containing polymer layer is formed, to remove the fluorine-containing polymer layer, where the second etching includes etching a surface of the dummy gate material layer.

Figure 7:
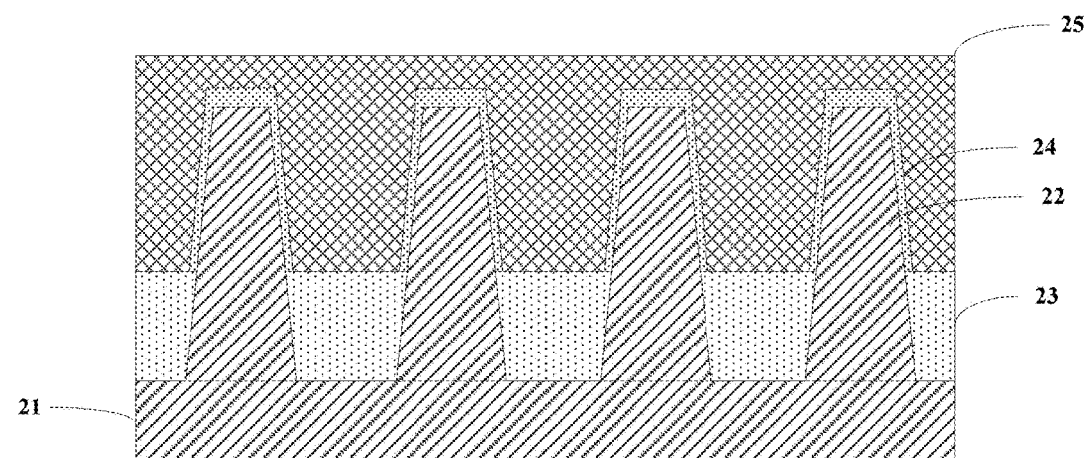
FIG. 7 illustratively shows a cross-sectional view of a structure in a stage of a process for manufacturing a semiconductor apparatus.

FIG. 7 illustratively shows a cross-sectional view of a structure in step S106 of a process for manufacturing a semiconductor apparatus. As shown in FIG. 7, second etching (for example, back etching) is performed on the substrate structure on which the fluorine-containing polymer layer is formed, to remove the fluorine-containing polymer layer 26, where the second etching includes etching a surface of the dummy gate material layer 25, so that the surface of the dummy gate material layer 25 is smoother and the thickness thereof is more uniform.

In this implementation, in the step of performing second etching, an etching rate of the second etching for the fluorine-containing polymer layer 26 is basically equal to an etching rate for the dummy gate material layer 25. Because in the foregoing process of depositing the fluorine-containing polymer layer, the fluorine-containing polymer is deposited relatively thickly at the recessed portion of the surface of the dummy gate material layer, and is deposited relatively thinly at the raised portion, and also because an etching rate of the second etching for the fluorine-containing polymer layer is basically equal to an etching rate for the dummy gate material layer, in the second etching, the raised portion of the surface of the dummy gate material layer can be etched more, and the recessed portion can be etched less, so that the surface of the dummy gate material layer is smoother and the thickness thereof is more uniform, as shown in FIG. 7.

It should be noted that the wording "basically equal" herein includes, but is not limited to being absolutely equal, and a specific error may exist, where $$Error = \frac{\text{Etching rate for fluorine-containing polymer layer} - \text{etching rate for dummy gate material layer}}{\text{Etching rate for dummy gate material layer}} \times 100\%.$$

For example, this error may be less than 10%. Certainly, it should be understood by those skilled in the art, the range of the error is not limited thereto.

In this implementation, the second etching may be performed by using $CF_4$ or $CH_2F_2$ as an etching gas.

In some implementations, the step of performing second etching by using $CF_4$ as an etching gas may include: in a reaction chamber, under conditions of an atmospheric pressure ranging from 10 to 200 mTorr (for example, the atmospheric pressure may be 20 mTorr, 50 mTorr, 100 mTorr, or the like), an operating power of an etching device ranging from 50 to 1000 watts (for example, the operating power of the etching device is 100 watts, 500 watts, 800 watts, or the like), and a gas flow rate of $CF_4$ ranging from 10 to 500 sccm (for example, the gas flow rate of $CF_4$ is 50 sccm, 100 sccm, 300 sccm, or the like), performing the second etching.

In other implementations, the step of performing second etching using $CH_2F_2$ as an etching gas may include: in a reaction chamber, under conditions of an atmospheric pressure ranging from 10 to 200 mTorr (for example, the atmospheric pressure may be 20 mTorr, 50 mTorr, 100 mTorr, or the like), an operating power of an etching device ranging from 50 to 1000 watts (for example, the operating power of the etching device is 100 watts, 500 watts, 800 watts, or the like), and a gas flow rate of $CH_2F_2$ ranging from 2 to 100 sccm (for example, the gas flow rate of $CH_2F_2$ is 10 sccm, 50 sccm, 80 sccm, or the like), performing the second etching.

Forms of a method for manufacturing semiconductor apparatus are provided above. In these forms, after a dummy gate material layer is formed, planarization processing is first performed on the dummy gate material layer. Then, first etching is performed according to surface roughness of the dummy gate material layer by using a fluorine-containing gas, so as to improve overall surface smoothness and thickness uniformity of the dummy gate material layer. Then a fluorine-containing polymer layer is formed on the dummy gate material layer, and second etching is performed on the substrate structure on which the fluorine-containing polymer layer is formed, to remove the fluorine-containing polymer layer, where the second etching further includes etching a surface of the dummy gate material layer, so as to further improve local surface smoothness and thickness uniformity of the dummy gate material layer. Therefore, implementations of the foregoing method can improve surface smoothness and thickness uniformity of the dummy gate material layer, thereby further improving performance of a device (for example, a transistor).

In some implementations, the foregoing manufacturing method may further include: cyclically performing the step of forming a fluorine-containing polymer layer (that is, step S105) and the step of performing second etching multiple times (that is, step S106). After the two steps are cyclically performed multiple times, surface smoothness and thickness uniformity of the dummy gate material layer can be further improved.

In some implementations, after the performing second etching (that is, step S106), the method may further include: performing ashing processing. For example, the ashing processing is performed on the structure shown in FIG. 7. In the foregoing process of the second etching, it is likely that the fluorine-containing polymer layer is not completely removed, and after the ashing processing, the remaining fluorine-containing polymer layer can be removed, so as to completely remove the fluorine-containing polymer layer.

Above, the present disclosure is described in detail. To prevent obstructing the ideas of the present disclosure, some well-known details in the art are not described. In light of the foregoing descriptions, those skilled in the art will understand how to carry out the technical solutions disclosed herein.

Although some specific embodiments and implementations of the present disclosure are described in detail using examples, those skilled in the art should understand that the foregoing examples are merely used for description and are not intended to limit the scope of the present disclosure. Those skilled in the art should understand that the foregoing embodiments and implementations may be modified without departing from the scope and spirit of the present disclosure. The scope of the present disclosure is defined by the appended claims.

What is claimed is:

1. A method for manufacturing a semiconductor apparatus, comprising:
   providing a substrate structure;
   depositing a dummy gate material layer on the substrate structure;
   performing planarization processing on the dummy gate material layer;
   after the planarization processing, performing, according to surface roughness of the dummy gate material layer, first etching on the dummy gate material layer using a fluorine-containing gas;
   after the first etching, forming a fluorine-containing polymer layer on the dummy gate material layer; and
   performing second etching on the substrate structure on which the fluorine-containing polymer layer is formed, to remove the fluorine-containing polymer layer, wherein the second etching comprises etching a surface of the dummy gate material layer.

2. The method according to claim 1, wherein the step of performing, according to surface roughness of the dummy gate material layer, first etching on the dummy gate material layer using a fluorine-containing gas comprises:
   detecting a raised portion and a recessed portion of the dummy gate material layer surface, to obtain the surface roughness of the dummy gate material layer;
   placing the substrate structure on an electro-static chuck (ESC), and setting a temperature of each region of the ESC according to the surface roughness of the dummy gate material layer, wherein in the ESC, a temperature of a region corresponding to the raised portion is higher than a temperature of a region corresponding to the recessed portion; and performing first etching on the dummy gate material layer using a fluorine-containing gas.

3. The method according to claim 2, wherein the step of performing first etching on the dummy gate material layer using a fluorine-containing gas comprises:

in a reaction chamber, under conditions of an atmospheric pressure ranging from 5 to 200 millitorrs (mTorr), an operating power of an etching device ranging from 100 to 1000 watts, and a bias voltage ranging from 0 to 300 volts, performing first etching on the dummy gate material layer using a fluorine-containing gas.

4. The method according to any one of claim 1, wherein the fluorine-containing gas comprises $CH_4F_6$, $CH_2F_2$, or $NF_3$.

5. The method according to claim 1, wherein in the step of performing second etching, an etching rate of the second etching for the fluorine-containing polymer layer is substantially equal to an etching rate for the dummy gate material layer.

6. The method according to claim 1, wherein the step of forming a fluorine-containing polymer layer on the dummy gate material layer comprises:

depositing a fluorine-containing polymer layer on the dummy gate material layer using a gas mixture containing $CH_3F$ and $Cl_2$ and using an inert gas as a carrier gas under a condition of a zero-bias voltage.

7. The method according to claim 6, wherein a material of the fluorine-containing polymer layer comprises a carbon-hydrogen-fluorine polymer.

8. The method according to claim 1, wherein the second etching is performed using $CF_4$ or $CH_2F_2$ as an etching gas.

9. The method according to claim 8, wherein the step of performing the second etching using $CF_4$ as an etching gas comprises: in a reaction chamber, under conditions of an atmospheric pressure ranging from 10 to 200 mTorr, an operating power of an etching device ranging from 50 to 1000 watts, and a gas flow rate of $CF_4$ ranging from 10 to 500 sccm, performing the second etching;

or, the step of performing the second etching using $CH_2F_2$ as an etching gas comprises: in a reaction chamber, under conditions of an atmospheric pressure ranging from 10 to 200 mTorr, an operating power of an etching device ranging from 50 to 1000 watts, and a gas flow rate of $CH_2F_2$ ranging from 2 to 100 sccm, performing the second etching.

10. The method according to claim 1, further comprising:

cyclically performing the step of forming a fluorine-containing polymer layer and the step of performing second etching multiple times.

11. The method according to claim 1, wherein the method further comprises: after performing the second etching, performing ashing processing.

12. The method according to claim 1, wherein a material of the dummy gate material layer comprises polysilicon or amorphous silicon.

13. The method according to claim 1, wherein in the step of providing a substrate structure, the substrate structure comprises: a semiconductor substrate, a semiconductor fin on the semiconductor substrate, a trench separation portion surrounding the semiconductor fin, and a dummy gate insulator layer on a surface of the semiconductor fin; and in the step of depositing a dummy gate material layer on the substrate structure, the dummy gate material layer covers the trench separation portion and the dummy gate insulator layer.

\* \* \* \* \*